US009599692B2

(12) United States Patent
Ritter

(10) Patent No.: US 9,599,692 B2
(45) Date of Patent: Mar. 21, 2017

(54) METHOD FOR DETERMINING A MAGNETIC RESONANCE CONTROL SEQUENCE, AND MAGNETIC RESONANCE SYSTEM OPERABLE ACCORDING TO THE CONTROL SEQUENCE

(71) Applicant: Siemens Aktiengesellschaft, Munich (DE)

(72) Inventor: Dieter Ritter, Fuerth (DE)

(73) Assignee: Siemens Aktiengesellschaft, Munich (DE)

( * ) Notice: Subject to any disclaimer, the term of this patent is extended or adjusted under 35 U.S.C. 154(b) by 456 days.

(21) Appl. No.: 14/297,731

(22) Filed: Jun. 6, 2014

(65) Prior Publication Data

US 2014/0361772 A1    Dec. 11, 2014

(30) Foreign Application Priority Data

Jun. 7, 2013  (DE) .......................... 10 2013 210 652

(51) Int. Cl.
| | | |
|---|---|---|
| *G01V 3/00* | (2006.01) | |
| *G01R 33/563* | (2006.01) | |
| *G01R 33/483* | (2006.01) | |
| *G01R 33/561* | (2006.01) | |

(52) U.S. Cl.
CPC ... *G01R 33/56333* (2013.01); *G01R 33/4838* (2013.01); *G01R 33/5612* (2013.01)

(58) Field of Classification Search
USPC ......................................................... 324/309
See application file for complete search history.

(56) References Cited

U.S. PATENT DOCUMENTS

| | | | | |
|---|---|---|---|---|
| 5,657,758 A | * | 8/1997 | Posse ................. | G01R 33/4833 324/307 |
| 2011/0181283 A1 | * | 7/2011 | Grinstead .......... | G01R 33/5635 324/309 |

(Continued)

OTHER PUBLICATIONS

"Spatial Domain Method for the Design of RF Pulses in Multicoil Parallel Excitation," Grissom et al., Magnetic Resonance in Medicine, vol. 56 (2006), pp. 620-629.

(Continued)

*Primary Examiner* — Rodney Fuller
(74) *Attorney, Agent, or Firm* — Schiff Hardin LLP

(57) ABSTRACT

In a method and control sequence determination device for determination of a magnetic resonance system control sequence to generate an image series of a defined image region of an examination subject, the control sequence includes a multichannel pulse train with multiple individual RF pulse trains to be emitted in parallel by the magnetic resonance system via different independent radio-frequency transmission channels. The multichannel pulse train includes an excitation pulse to excite the image region and a subsequent number of refocusing pulses in order to respectively excite an echo signal to acquire raw data for an image of the image series. At least one defined marking region in the image region is determined depending on a subject structure to be depicted in the image region, and the multichannel pulse train is determined such that a saturation is achieved at or in the marking regions before the excitation pulse.

17 Claims, 3 Drawing Sheets

(56) References Cited

U.S. PATENT DOCUMENTS

| | | | |
|---|---|---|---|
| 2012/0025824 A1* | 2/2012 | Harder | G01R 33/56383 |
| | | | 324/309 |
| 2012/0025825 A1 | 2/2012 | Porter | |
| 2012/0197103 A1 | 8/2012 | Sorensen | |
| 2013/0154642 A1* | 6/2013 | Sueoka | G01R 33/34015 |
| | | | 324/309 |
| 2013/0249550 A1* | 9/2013 | Feiweier | G01R 33/563 |
| | | | 324/309 |
| 2014/0077807 A1* | 3/2014 | Edelman | G01R 33/5635 |
| | | | 324/309 |
| 2015/0241535 A1* | 8/2015 | Grodzki | G01R 33/543 |
| | | | 324/309 |
| 2016/0116557 A1* | 4/2016 | Feiweier | G01R 33/543 |
| | | | 324/309 |

OTHER PUBLICATIONS

"A κ-Space Analysis of Small-Tip-Angle Excitation," Pauly et al., Journal of Magnetic Resonance, vol. 81 (1989), pp. 43-56.

"Design Algorithms for Parallel Transmission in Magnetic Resonance Imaging," Setsompop, K., Doctoral Thesis, Department of Electrical Engineering and Computer Science, Massachusetts Institute of Technology (2008), pp. 1-157.

* cited by examiner

180
METHOD FOR DETERMINING A MAGNETIC RESONANCE CONTROL SEQUENCE, AND MAGNETIC RESONANCE SYSTEM OPERABLE ACCORDING TO THE CONTROL SEQUENCE

BACKGROUND OF THE INVENTION

Field of the Invention

The invention concerns a method to determine a magnetic resonance system control sequence to generate an image series of a defined image region of an examination subject. The magnetic resonance system control sequence includes a multichannel pulse train with multiple individual RF pulse trains to be emitted in parallel by the magnetic resonance system via different independent radio-frequency transmission channels of a transmission device. The multichannel pulse train includes an excitation pulse to excite the image region, as well as a subsequent number of refocusing pulses in order to respectively excite an echo signal to acquire raw data for an image of the image series. Furthermore, the invention concerns a method to generate an image series of a defined image region using such a magnetic resonance system control sequence, and a method to determine structural data of an examination subject based on such an image series. Moreover, the invention concerns a corresponding control sequence determination device to determine an aforementioned magnetic resonance system control sequence for an image series, as well as a structural data determination device to determine structural data of an examination subject on the basis of a corresponding image series, and a magnetic resonance system comprising such a control sequence determination device and/or structural data determination device.

Description of the Prior Art

In a magnetic resonance system, the body to be examined is typically exposed to a relatively high basic magnetic field (known as the $B_0$ field)—for example of 1.5 Tesla, 3 Tesla or 7 Tesla—with the use of a basic field magnet system. A magnetic field gradient is additionally applied by a gradient system. Radio-frequency excitation signals (RF signals) are then emitted via a radio-frequency transmission system by suitable antenna devices, which cause nuclear spins of defined atoms excited to resonance by this radio-frequency field to be flipped (deflected) by a defined flip angle relative to the magnetic field lines of the basic magnetic field. The radio-frequency magnetic field is also designated as a $B_1$ field. This radio-frequency excitation, or the resulting flip angle distribution, is also designated in the following as a nuclear magnetization, or "magnetization" for short. Upon the relaxation of the nuclear spins, radio-frequency signals (known as magnetic resonance signals) are radiated that are received by means of suitable reception antennas and then are processed further. Finally, the desired image data can be reconstructed from the raw data acquired in such a manner.

It is conventional to operate the transmission antennas of the radio-frequency transmission system in a "homogeneous mode". For this purpose, a single temporal RF signal is passed to all components of the transmission antennas) so that an optimally homogeneous $B_1$ field is present in the region of the examination subject from which data are to be acquired. In newer magnetic resonance systems, it has by now become possible to populate individual transmission channels with individual RF signals adapted to the imaging. For this purpose, a multichannel pulse train is emitted that (as described above) includes multiple individual radio-frequency pulse trains that can be emitted in parallel via the different independent radio-frequency transmission channels. In the measurement space (and consequently also in the patient), the previously homogeneous excitation can thereby be replaced by an excitation that, in principle, is arbitrarily shaped. Such a multichannel pulse train—also designated as a "pTX pulse" due to the parallel emission of the individual pulses—can include excitation, refocusing and/or inversion pulses.

The matching RF pulse train for the individual channels is typically designated with a suitable optimization program so that the local target magnetization distribution is achieved. For example, a method to develop such a multichannel pulse train in parallel excitation methods is described by W. Grissom et al.: "Spatial Domain Method for the Design of RF Pulses in Multicoil Parallel Excitation", Mag. Res. Med. 56, 620-629, 2006. For a specific measurement, the different multichannel pulse trains that are to be emitted via the different transmission channels of the transmission device, the gradient pulse train (with matching x-, y- and z-gradient pulses) to be emitted in coordination therewith, and additional control specifications are defined in a measurement protocol, which is created in advance and (for example) can be retrieved from a memory for a specific measurement and be modified on site by the operator as necessary. During the measurement, the control of the magnetic resonance system then takes place wholly automatically on the basis of this measurement protocol, with the control device of the magnetic resonance system reading out and executing the commands from the measurement protocol.

In particular for an examination of moving subject structures (for example of the heart of a patient), for the determination of specific information it is helpful to acquire not only individual images but also an entire image series of the structure of interest in order to thus detect structural changes over time, for example how a heart chamber deforms during the movement of the heart. For this purpose, it is known (for example within the scope of a classical EPI sequence) to emit an excitation pulse in order to initially selectively excite the tissue in the desired image region (for example a slice through the heart) and then to emit a subsequent number of refocusing pulses, so an echo signal is induced in the tissue of the excited image region, which echo signal can be acquired as raw data for an image of the image series. This means that an excitation of the desired slice is implemented once and a single MR image of the slice can be acquired for each echo signal, respectively at an interval of approximately 30 ms, in a subsequent readout train, until the transverse decay of the magnetization (which takes approximately 1 s). This has also previously been implemented with a classical excitation without the use of pTX pulses. In order to increase the ability to detect the movement of the structure within the individual images and to allow an automatic image processing, wide-area sinc saturation pulses have conventionally been radiated in order to achieve as a "tagging" before the excitation. The sinc saturation pulses cause a lateral, periodic, stripe-shaped signal suppression within the image region. The images of the image series are then populated with a stripe pattern or grid pattern, and the stripe structure or grid structure deforms together with the movement of the structure. These global stripes or grids overlaying the entire individual MR images have an extraordinarily interfering effect on a normal viewing of the images, and in addition valuable image information that (for example) is located under a stripe may possibly not be detected.

SUMMARY OF THE INVENTION

An object of the present invention is to achieve an improved method to generate an image series of a defined image region with a method of the type described above, as well as an improved evaluation method for the images series that are generated with this, as well as a corresponding device.

In the method according to the invention for the determination of a magnetic resonance system control sequence, as conventional, a magnetic resonance system control sequence with an excitation pulse to excite the image region and a subsequent number of refocusing pulses is generated in order to excite an echo signal to acquire raw data for an image of an image series of this image region. A magnetic resonance system control sequence is generated that has a multichannel pulse train with multiple individual pulse trains to be emitted in parallel by the magnetic resonance system via different, independent radio-frequency transmission channels of a transmission device. This means that a pTX pulse series is generated in order to acquire the desired image series of the defined, selected image region, for example a specific field of view, or a slice or an arbitrary 3D volume. As used herein, an image series means an arbitrary series of two-dimensional or three-dimensional images or image data. It is important that the same subject is acquired multiple times in quick succession in a manner known as a "cine-mode". The sequence is preferably an EPI (echoplanar imaging) sequence.

According to the invention, at least one defined marking region within the image region is determined depending on a subject structure (such as an anatomical structure) to be shown in the image region. For example, such a marking region indicates defined positions or position data where a marking should take place within the image. The multichannel pulse train is then determined such that a pTX saturation pulse is emitted before the excitation pulse in order (for example) to generate a saturation of the nuclear spins of the material or tissue precisely at and/or in the marking regions that were previously determined specifically for the appertaining subject structure. Thus a defined localization magnetization is already generated in the marking regions before the excitation pulse, so that an acquisition of raw data can no longer take place at these points due to the additional portion of the multichannel pulse train that follows the saturation pulse. The marking at which the material of the subject structure was saturated before the excitation is thereby precisely detectable at the positions in the images of the image series. By the emission of a pTX saturation pulse (which can be precisely spatially tailored, and is not emitted globally over the image region as is conventional) it is thus possible to also produce a marking that is precisely spatially defined and matches the desired subject structure (in particular, the target magnetization for the saturation pulse is defined via the determination or, respectively, establishment of the marking region). Since this marking relates to the material of the structure itself, as given the previous sinc saturation pulses, the position of this marking within the image series also varies with the movement of the examined structure. In other words: the marking is established not with regard to its position within the image coordinates of the generated image data but rather (due to the saturation of the corresponding regions in the structure) with regard to the structure, and varies (i.e. its position and/or shape) from image to image within the image series.

In the method according to the invention for the generation of such an image series of a defined image region of an examination subject by operation of a magnetic resonance system, it is merely necessary to control the magnetic resonance system with a correspondingly determined magnetic resonance system control sequence.

In the method according to the invention for the determination of structural data of an examination subject, an image series of a defined image region of the examination subject can initially be acquired that was generated by the magnetic resonance system with such a method. Within the images of the image series, the markings of the subject structure can then be identified that were achieved by the locally defined saturation. The determination of the structural data can subsequently take place using the identified markings in the different images of the image series. As used herein, "structural data" encompass geometric dimension data (data about defined dimensions) of an organ, bone or parts thereof (a heart, a heart chamber, or heart valve, etc., for example). "Structural data" also encompass data that can be derived from the dimension data, for example data that can be determined or calculated depending on the time, i.e. its variation across the different images of the image series. Typical examples of this are data about the ejection fraction, the pumping efficiency of a heart, etc., which can be determined from the temporal variation of dimension data of a heart chamber.

Through the targeted marking of the image data by saturation in well-defined, precisely predetermined marking regions depending on the subject structure, and no longer globally by a stripe pattern over the entire image as before, it is possible to make defined, important structures and their variation over the image series (for example the wall of a heart, etc.) better visible, and to simultaneously ensure that other structures are not unnecessarily occluded by a pattern, whereby image information is lost. The evaluation of the data in automatic or semi-automatic form is also significantly simpler.

A control sequence determination device according to the invention is designed to determine a magnetic resonance system control sequence to generate an image series of a defined image region of an examination subject, wherein the magnetic resonance system control sequence includes a multichannel pulse train with multiple individual RF pulse trains to be emitted in parallel by the magnetic resonance system via different independent radio-frequency transmission channels of a transmission device. The magnetic resonance system control sequence is also designed so that the multichannel pulse train includes an excitation pulse to excite the image region as well as a subsequent number of refocusing pulses in order to respectively excite an echo signal for acquisition of raw data for an image of the image series. The control sequence determination device has a marking region determination unit in order to determine at least one defined marking region in the image region depending on a subject structure to be shown in the image region. For example, this marking region determination unit can have a user interface, for example in order to set markings graphically within overview measurements of the desired image region, but also a device that automatically determines or selects automatically determined marking regions. In addition to this, the control sequence determination device is designed—i.e. is equipped with a corresponding radio-frequency pulse determination unit and gradient calculation unit, etc., so that it determines a multichannel pulse train in which a (pTX) saturation pulse is radiated (i.e., is included in the pulse train) before the excitation pulse in order to achieve a saturation (and thus the desired marking) at and/or in the marking regions upon emission of this saturation pulse.

A corresponding structural data determination device to determine structural data of an examination subject has an image data interface to acquire the image series of a defined image region of the examination subject that was generated in the predetermined manner according to the invention. In addition, the structural data determination device has a marking determination unit to identify markings of a subject structure in the images of the image series that have been achieved by the locally defined saturation generated by means of the saturation pulse. Furthermore, the structural data determination device has a suitable analysis device for this purpose, for example so that the determination of the structural data takes place using the identified markings in the various images of the image series.

For example, a magnetic resonance system according to the invention has a transmission device with a number of independent radio-frequency transmission channels, and with a control device that is designed to emit a multichannel pulse train with multiple parallel, individual pulse trains via the different radio-frequency transmission channels in order to implement a desired measurement on the basis of a predetermined control sequence, and to emit in coordination with this a gradient pulse train via the gradient system. According to the invention, this magnetic resonance system moreover has a control sequence device of the aforementioned type in order to determine a control sequence and provide this to the control device, and/or a structural data determination device in the aforementioned manner in order to evaluate the images of the image series in the desired manner.

Significant portions of the structural data determination device—in particular the marking region determination unit and possibly an RF pulse determination unit and/or a gradient calculation unit—can be fashioned in the form of software components. The same applies to the structural data determination device, in particular its marking determination unit and analysis unit. For example, the marking region determination unit can also have an interface in order to select and receive image data of a prior measurement (overview measurement, for example) from a data store (possibly also using a user interface) arranged within the control sequence determination device or connected with this via a network. For example, this can be an (in particular graphical) user interface that can also serve for manual input of marking regions. The control sequence determination device preferably also has a control sequence output interface (i.e. an interface that transmits the control sequence to the magnetic resonance controller in order to directly control the measurement with this, for example) and an interface that sends the data via a network and/or stores the data in a memory for later use. All interfaces can likewise be fashioned at least partially in the form of software, and may possibly access hardware interfaces of a computer.

The invention thus also encompasses a non-transitory, computer-readable data storage medium encoded with programming instructions that can be loaded directly into a memory of a control sequence determination device and/or a structural data determination device, with program code segments in order to execute all steps of the method according to the invention in the control sequence determination device and/or structural data determination device. Such a realization in software has the advantage that existing devices that are used to determine control sequences and/or to determine structural data by a suitable evaluation of the acquired image series can also be suitably modified by implementation of the programming instructions in order to determine control sequences or, respectively, structural data in the manner according to the invention.

There are various possibilities to establish the marking regions. In a preferred variant, the marking region or marking regions are determined based on prior measurement image data of the subject, i.e. from image data of the subject from a prior measurement, for example a suitable overview measurement or topogram, of a usable measurement that has previously taken place from a prior examination, or of an image created specifically to establish the marking regions, etc.

A marking region can have one part or multiple parts, the latter meaning that the marking region is composed of multiple marking sub-regions. Such marking regions or marking sub-regions can include local, separate marking points, meaning that individual points within the image data are marked. However, marking regions in the form of outlines or bordering contours etc., as well as a combination of individual marking points, marking lines, marking contours are also possible, as will be explained in detail below.

The marking region, in particular the individual, local, separate marking point or points, is preferably correlated with at least one anatomical landmark in the image region. Different anatomical landmarks are typically specified in lists or anatomical atlases, and therefore are very often used as reference points for other evaluations.

In a preferred variant, the marking region is determined on the basis of a contour of a structure, in particular the subject structure or a substructure thereof, in the image region. For example, this contour can be a heart wall that encloses a complete heart chamber. Particularly preferably, a marking region is selected so that it surrounds at least one such anatomical structure in the image region, for example so that it encloses a complete heart chamber in a ring, so that the volume of the heart chamber can then also very simply be determined in the images later with the aid of the marking. Other structures (for example the entirety of the lung tissue) can likewise be enclosed by a marking in order to determine the volume of the lung.

Image data of the subject can be automatically determined or extracted from a prior measurement to determine the marking region. As used herein, "automatic" encompasses a fully automatic as well as a semi-automatic procedure, wherein specific designations of an organ or anatomical landmarks can be made by the user, and then these landmarks or organs and their contours are sought automatically in images of the prior measurement. The marking regions are then accordingly placed so as to match, for example by individual separate marking points being placed on the landmarks, or by contours of the cited subjects being enclosed by surrounding marking regions or marking lines.

In the method according to the invention to determine structural data based on the image series, the specific evaluation correlates with (among other things) the type of the marking regions.

A determination of structural data preferably takes place using geometric dimensions of at least regions of the identified markings and/or dimensions between different identified markings, for example the distances between two markings or the diameter of an annular marking contour.

In many cases, it is not the absolute positions within the images of the image series that matter, but rather only the relative positions. Therefore, a determination of the structural data advantageously takes place using position variations of the identified markings in the different images of the image series. This means that the same markings are respectively identified in individual images of the image series, and their positions in the individual images of the image series are determined. Based on these position variations, conclusions can very simply be made about how the structure has spatially varied in the different images.

Volume variations of the subject structure can be detected wholly automatically in a relatively simple manner solely by the determination of simple diameters or distances between different marking points or their variations from image to image, and from these additional structural data can then be derived (such as the ejection fraction, as already mentioned).

However, it is advantageously ensured that all images of the image series are generated with the same scaling with regard to the same spatial attitude of the images relative to the magnetic resonance system, meaning that a different magnification factor or a spatial displacement of the image coordinates or other distortion (deviation) in any direction is not present between two images of the image series.

DESCRIPTION OF THE PREFERRED EMBODIMENTS

Figure 1:
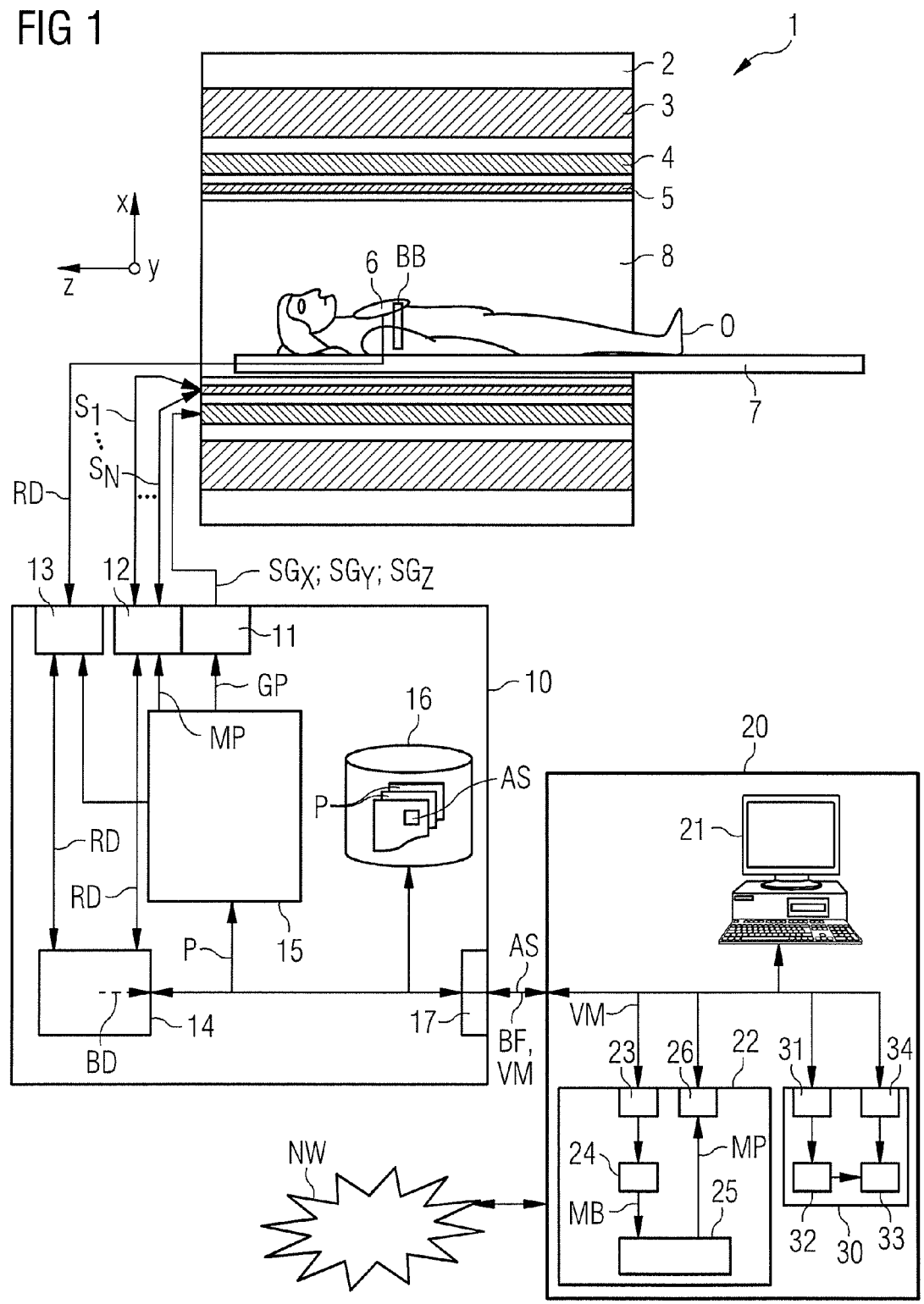
FIG. 1 is a schematic depiction of an exemplary embodiment of a magnetic resonance system according to the invention.

A magnetic resonance system 1 is schematically depicted in FIG. 1. The system 1 includes the actual magnetic resonance scanner 2 with an examination space 8 or patient tunnel located therein. A bed 7 can be moved into this patient tunnel 8, such that during an examination an examination subject O (for example a patient lying atop the bed 7) can be supported at a defined position within the magnetic resonance scanner 2 relative to the magnet system and radio-frequency system arranged therein and/or is movable between different positions during a measurement.

Basic components of the magnetic resonance scanner 2 are a basic field magnet 3, a gradient system 4 with magnetic field gradient coils in order to apply arbitrary magnetic field gradients in the x-, y- and z-directions, as well as a whole-body radio-frequency coil 5 (or, respectively, body coil). The reception of magnetic resonance signals produced in the examination subject O can take place via the whole-body coil 5 with which the radio-frequency signals are normally emitted to produce the magnetic resonance signals. However, these signals are typically received with local coils 6 placed on or below the examination subject O, for example. Moreover, these local coils 6 can be used to receive and to transmit. All of these components are known in principle to those skilled in the art, and therefore need only be schematically depicted in FIG. 1.

The whole-body radio-frequency coil 5 in this exemplary embodiment is constructed in a form known as a birdcage antenna, and has a number N of individual antenna rods that proceed parallel to the patient tunnel 8 and are uniformly distributed on a periphery around the patient tunnel 8. The individual antenna rods are each capacitively connected in the form of a ring at their ends.

The individual antenna rods here can be controlled separately by a control device 10 via individual transmission channels $S_1, \ldots, S_N$. This control device 10 can be a control computer that can be formed by multiple individual computers that may be spatially separated and connected among one another via suitable cables or the like.

Via a terminal interface 17, this control device 10 is connected with a terminal 20 via which an operator can control the entire system 1. In the present case, this terminal 20 has a user interface 21 with a keyboard, one or more monitors, as well as additional input devices (for example mouse or the like) so that a graphical user interface is provided to the operator.

Among other things, the control device 10 has a gradient control unit 11 that can include multiple sub-components. Via this gradient control unit 11, the individual gradient coils are fed control signals $SG_x$, $SG_y$, $SG_z$. These represent gradient pulses that are placed at precisely provided time positions and with a precisely predetermined time curve during a measurement (data acquisition).

Moreover, the control device 10 has a radio-frequency transmission/reception unit 12. This RF transmission/reception unit 12 likewise has multiple sub-components in order to respectively provide radio-frequency pulses separately and in parallel for the individual transmission channels $S_1, \ldots S_N$, i.e. to the individually controllable antenna rods of the body coil 5. Magnetic resonance signals can also be received via the transmission/reception unit 12. However, this typically occurs with the aid of the local coils 6. The raw data RD received with these local coils 6 are read out and processed by an additional RF transmission/reception unit 13. The magnetic resonance signals received by these (or by the whole-body coil) by means of the RF transmission/reception unit 12 are provided as raw data RD to the reconstruction unit 14, which reconstructs the image data therefrom (in the present case, the images of the desired image series BF) and stores the image data in a memory and/or passes them via the interface 17 to the terminal 20 so that the operator can view the corresponding images. The image data or the images of the image series BF can also be stored and/or displayed and evaluated at other locations via a network NW.

The gradient controller 11, the RF transmission/reception unit 12 for the body coil 5 and the RF transmission/reception unit 13 for the local coils 6 are respectively controlled in coordination by a measurement control unit 15. Via appropriate commands, this ensures that a desired gradient pulse train GP is emitted via suitable gradient coil signals $SG_x$, $SG_y$, $SG_z$ and controls the RF control unit 12 in parallel so that a multichannel pulse train MP is emitted, meaning that (for example) the matching radio-frequency pulses are provided in parallel to the individual transmission rods of the whole-body coil 5. Moreover, it must be ensured that the magnetic resonance signals are read out at local coils 6 by the RF transmission/reception unit 12 at the matching point in time and are processed further. The measurement control unit 15 provides the corresponding signals (in particular the multichannel pulse train MP) to the radio-frequency transmission/reception unit 12 and the gradient pulse train GP to the gradient coil unit 11 according to a predetermined control sequence AS that is part of a control protocol P. All control data that must be set during a measurement are stored in this control protocol P.

A number of control protocols P for different measurements are typically stored in a memory 16. These can be selected (and varied as necessary) by the operator via the terminal 20 in order to then provide a matching control protocol P for the current desired measurement with which the measurement control unit 15 can work. Moreover, the operator can also retrieve control protocols via a network NW (for example from a manufacturer of the magnetic resonance system) and then modify and use protocols as necessary.

However, the basic workflow of such a magnetic resonance measurement and the cited components for control are known to those skilled in the art, such that they do not need to be described herein in further detail. Moreover, such a magnetic resonance scanner 2 as well as the associated control device can also have additional components that are not explained in detail herein because they do not have an impact on the present invention.

The magnetic resonance scanner 2 can be of a different design (for example with a patient space that is open to one side), and the radio-frequency whole-body coil does not need to be designed as a birdcage antenna. In the above example according to FIG. 1, the RF transmission/reception unit 12 with the body coil 5 and the RF transmission/reception unit 13 with the local coils 6 can each be considered as transmission devices in the sense of the present invention. It is only significant that the transmission device have multiple, separately controllable transmission channels $S_1, \ldots, S_N$.

Moreover, in FIG. 1 a control sequence determination device 22 is schematically shown that serves to determine a magnetic resonance system control sequence AS. This magnetic resonance system control sequence AS includes (among other things) a predefined multichannel pulse train MP to control the individual transmission channels $S_1, \ldots, S_N$ for a defined measurement. In the present case, the magnetic resonance system control sequence AS is created as part of a control protocol P.

Moreover, a structural data determination device 30 to determine structural data of an examination subject is also depicted in FIG. 1, with the aid of which structural data determination device 30 specific structural data can then be obtained using identified markings from the different images of the image series, as will be explained further.

Both the control sequence determination device 22 and the structural data determination device 30 here are depicted as part of the terminal 20 and can be realized predominantly in the form of software components at the computer of this terminal. In principle, the control sequence determination device 22 and/or the structural data determination device 30 can also be part of the control device itself, or be realized at separate computer systems that are also separate from one another. For example, the finished magnetic resonance system control sequences AS created at a separate computer can possibly also be transmitted via a network NW to the magnetic resonance system 1 within the framework of a complete control protocol P. The finished image series can likewise be transmitted via a network NW to another computer at which the structural data determination device 30 is realized in order to evaluate the image series.

The control sequence determination device 22 here has an input interface 23. Among other things, a target magnetization and a gradient trajectory can typically be provided to the control sequence determination device 22, based on which an RF pulse optimization unit 25 automatically determines a defined control sequence with an optimal multichannel pulse train MP to achieve the desired target magnetization. This can take place with a conventional pulse optimization method, for example as it is described in the preceding in connection with the aforementioned article by W. Grishom et al. A large variety of optimization criteria can be taken into account, in particular also criteria regarding the SAR exposure of the patient during the measurement. In particular, the $B_1$ maps and the $B_0$ maps can be used individually in the calculation of the pTX pulses, both of the excitation and refocusing pulses and of the pTX saturation pulse SP according to the invention, wherein the $B_1$ maps respectively specify a spatial sensitivity of the individual transmission channels and the $B_0$ maps represent the spatial inhomogeneity of the $B_0$ field in the desired image region. In this context it is noted that a pTX saturation pulse SP can in principle be calculated in the same manner as a normal pTX excitation pulse or pTX refocusing pulse. It is only necessary that the spatial target magnetization (i.e. the flip angle distribution that should be achieved with this pTX saturation pulse SP) is adapted to the marking region MB, for example such that a flip angle of 90° already exists exactly in the marking region MB before emission of the excitation pulse, and the flip angles in the marking region are reset again in the z-direction (and thus can no longer contribute to the imaging) at the subsequent excitation pulse (which, for example, generates an additional homogeneous flip angle flip by 90° in the entire image region). The RF pulse optimization unit 25 can, moreover, include a gradient pulse calculation unit (not shown) in order to calculate the gradients to match the radio-frequency pulses.

In the present case, the control sequence determination device should create a magnetic resonance system control sequence to generate an image series in the cine-mode, wherein precisely defined marking regions in the tissue of the desired subject structure to be depicted are initially saturated by a pTX saturation pulse so that raw data can no longer be acquired from these regions in the subsequent image data acquisition, and thus a marking predetermined depending on the tissue position is implicitly visible in the images. An excitation pulse should then follow this pTX saturation pulse in order to excite the image region or, respectively, the tissue located therein, and then a number of refocusing pulses in order to generate the desired raw image data for the desired images of the image series in quick succession. In order to be able to determine the marking regions, the control sequence determination device here has a marking region determination unit 24. As mentioned above, for this purpose the marking region determination unit 25 can use prior measurement image data VM (i.e. image data from a prior measurement) of the subject structure which, for example, here can also be received via the interface 23. For example, this marking region determination unit 24 can then graphically select (via a user interface 21) precisely the desired regions that should be marked, for example a heart wall or defined anatomical landmarks.

Furthermore, the control sequence determination device 22 has an RF pulse optimization unit 25 in order to generate the desired multichannel pulse MP in the typical manner, wherein the spatial objectives for the saturation pulse that were determined in the marking region determination unit 24 are taken into account, however.

Via an interface 26, the complete control sequence AS is then passed to the control device 10 via the terminal 20, for example via the terminal interface 17.

The structural data determination device 30 has an image data interface 31 via which an image series BF of the defined image region BB (which was likewise established by an operator before the measurement by means of the prior measurement image data VM, for example) can be acquired. This image series BF is then initially passed to a marking determination unit 32, which identifies the markings M in the images of the image series. This is relatively simple because these are regions in which no image data have been acquired, i.e. in which no image data are present for the respective pixels or, respectively, voxels. For example, in a typical MR image these points occur as black regions, as this is apparent in the image series schematically depicted in FIG. 3.

The identified markings M, or the position information where these markings M are situated, are then passed to the analysis unit 33, which determines the desired structural data SD using the identified markings in the various images of the image series. For example, the analysis unit 33 can estimate a defined volume of this subject or determine the variations of distances between two markings based on surrounding markings (which, for example, follow the contours of a defined subject in the images), evaluate them accordingly and then, based on these, determine relevant data (i.e. the structural data) for a diagnosis, for example. The structural data SD can then be provided as an output again to the terminal 20 via an output interface 34 and/or be stored at a suitable point.

The entire method is explained again in the following using FIG. 2, wherein the components of the control sequence determination device 22 or, respectively, of the structural data determination device 30 that are described above can be used.

For example, in a first Step I prior measurement image data VM can initially be measured over the desired region of the examination subject or over the complete examination subject with a conventional measurement sequence, meaning that a suitable topogram or the like is generated, for example.

For this purpose, the prior measurement image data VM can then be used in Step II in order to place the marking regions MP, or to specify, in the manner described above, in which regions of the subject structure the tissue should be irradiated with a saturation pulse so that no image data are acquired in these regions in the later acquisition of the image series.

The marking regions MB or their position data are then used to calculate the pTX saturation pulse SP (in particular its target magnetization) within Step III, in which the magnetic resonance system control sequence AS is calculated. In Step IV, the control of the magnetic resonance system or, respectively, the acquisition of the raw data RD for the desired image series then takes place with the aid of the finished control sequence AS. These raw data RD are used in Step V in order to reconstruct the images of the image series BF.

Figure 3:
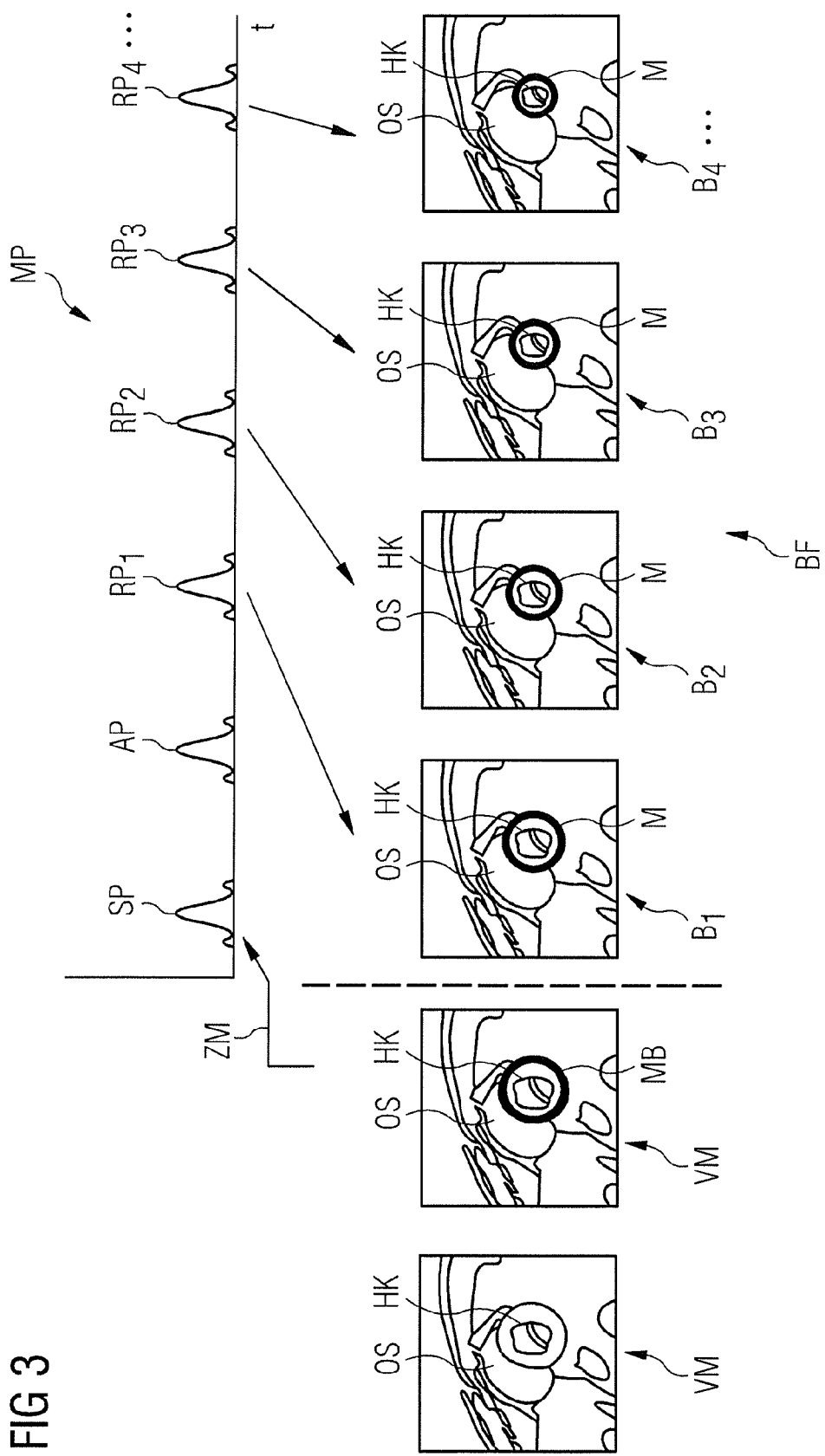
FIG. 3 is a schematic depiction of an example of a radio-frequency pulse train, and an image series generated with this whose images show a marking generated according to the invention.

In the upper region, FIG. 3 schematically shows a multichannel pulse train MP plotted over a time axis, i.e. a chain of pTX radio-frequency pulses over time t, composed of a saturation pulse SP, a subsequent excitation pulse AP and then a number of additional refocusing pulses $RP_1$, $RP_2$, $RP_3$, $RP_4$, . . . , wherein here only four refocusing pulses $RP_1$, $RP_2$, $RP_3$, $RP_4$, . . . are shown. All pulses are presented in a very simplified manner in FIG. 3 because only with the temporal arrangement relative to one another is intended to be shown. The amplitude curve of these pTX pulses actually has a significantly more complicated course. Naturally, suitable gradient pulses must additionally also be executed, in particular in order to respectively achieve the spatial coding.

Likewise schematically shown as an example in this depiction of the multichannel pulse train MP is an image series BF that can be generated with this pulse train MP. However, the first image to the far left shows prior measurement image data BM (i.e. an image measured before the start of the current pulse train MP) with the subject structure OS (here for example a heart with a heart chamber HK). In the second image to the right of this is shown how a marking region MB has been placed in this prior measurement image data VM. This marking region MB here is a simple circle which precisely surrounds a heart chamber. For schematic reasons, here the marking region is drawn with a relatively thick line. In practice, this line can naturally be significantly finer so that less of the image region is covered by the marking. This marking region MB now provides a target magnetization ZM for the pTX saturation pulse SP. The pTX saturation pulse SP is thus designed so that it selectively achieves a flip angle deflection of 90° only in the tissue of the marking region MB.

The excitation pulse AP (likewise of 90°, for example) and the following refocusing pulses $RP_1$, $RP_2$, $RP_3$, $RP_4$, . . . (of 180°, for example) are then subsequently executed in a typical manner. However, both the excitation pulse AP and the refocusing pulses $RP_1$, $RP_2$, $RP_3$, $RP_4$, . . . act as homogeneously as possible in the entire image region BB (i.e. for example in the entire selected slice). The flip angle is thus initially flipped by 90° in the entire image region by the excitation pulse AP, and a flip angle of 180° is achieved only in the marking region MB since here a flip angle of 90° already existed. The spins in the marking region MB are consequently aligned parallel to the z-axis again so that the subsequent refocusing pulses $RP_1$, $RP_2$, $RP_3$, $RP_4$, . . . can also no longer induce an echo in this marking region MB.

The image series BF shown below the multichannel pulse train MP thus results, wherein the individual images $BD_1$, $BD_2$, $BD_3$, $BD_4$, . . . are respectively acquired in the different readout phases after the successive refocusing pulses $RP_1$, $RP_2$, $RP_3$, $RP_4$, . . . of the magnetic resonance system control sequence AS. All images $BD_1$, $BD_2$, $BD_3$, $BD_4$, . . . of the image series BF show exactly the same subject structure OS as the first image located to the far left (the prior measurement image data VM) in which the marking region MB has been indicated with the use of a graphical user interface, but in different movement phases. The time interval between these individual images $BD_1$, $BD_2$, $BD_3$, $BD_4$, . . . is normally in the ms range (for example around 30 ms).

The marking M—which was generated in that no image data could be acquired in the corresponding tissue region because the tissue was saturated by the exactly specified, spatially selective pTX saturation pulse SP before emission of the excitation pulse AP and of the refocusing pulses $RP_1$, $RP_2$, $RP_3$, $RP_4$, . . . —is thereby clearly visible in each image $BD_1$, $BD_2$, $BD_3$, $BD_4$, . . . of the image series BF. Here it is also clearly visible that the marking M is not fixed relative to the frame of the individual images (i.e. the image coordinates), but rather with regard to the subject structure OS itself, meaning that the marking M always remains in the region of the wall of the heart chamber HK. The diameter of this circular marking M here is thus always linked to the current volume of the heart chamber HK. This shows that an evaluation of the image series BF is possible in a relatively simple manner in order to determine defined structural data, for example here the volume of the heart chamber HK depending on the images $BD_1$, $BD_2$, $BD_3$, $BD_4$, . . . of the image series, and thus depending on the time.

Figure 2:
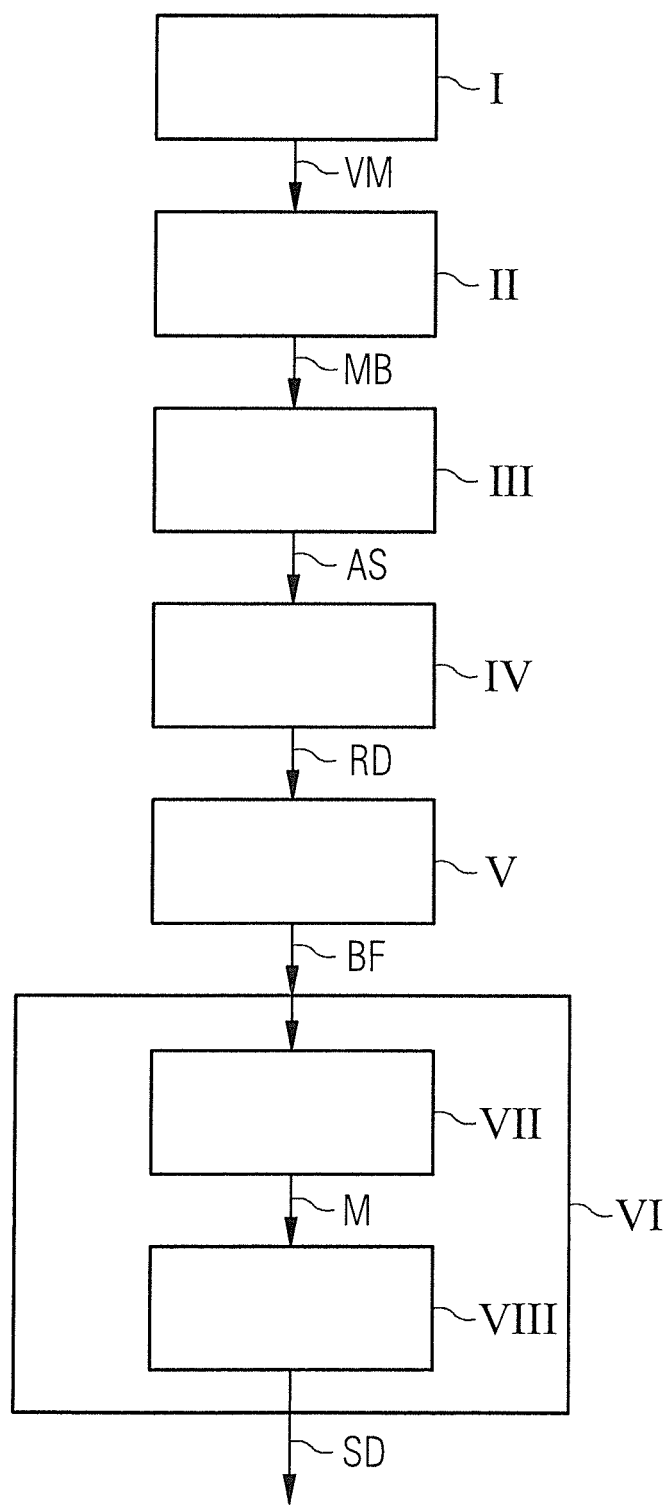
FIG. 2 is a flowchart of an exemplary embodiment of the method according to the invention.

Such an evaluation of the image series BF can take place in Step VI in FIG. 2. Step VI includes two sub-steps, a first of which is Step VII in which the markings M are sought in the images $BD_1$, $BD_2$, $BD_3$, $BD_4$, . . . . This is possible in a relatively simple manner since no image information is present in the image data at this point. In a subsequent Step VIII, these markings M are then analyzed and evaluated or the position data of the markings M are evaluated depending on the image data or the time in order to arrive at the desired structural data SD.

As could be shown in the previous example, with the aid of dynamic pTX pulses—in particular with the aid of a dynamic pTX saturation pulse—is thus simply possible to specifically saturate a well-defined geometric region within the anatomical MR image, and thus to directly mark organ boundaries, organ regions or other anatomical landmarks. The interfering global bands are thereby eliminated, and a robust automatic visualization or measurement of the entire volume movement is possible.

In conclusion, it is noted again that the methods and designs described in detail in the preceding are exemplary embodiments, and that the basic principle can also be varied within wide ranges by those skilled in the art without departing from the scope of the invention. In particular, the use of the invention is not limited to cardiac exposures, but rather can also advantageously be used in magnetic resonance acquisitions of arbitrary moving subjects (in particular in a non-medical field).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to determine a control sequence for a magnetic resonance system comprising a plurality of different, independent radio-frequency (RF) transmission channels, said method comprising:
    in a computerized processor, defining a control sequence to generate an image series of a defined image region of an examination subject, said control sequence comprising a multichannel pulse train that causes said different independent RF transmission channels to radiate respective RF pulse trains in parallel;
    in said computerized processor, including an excitation pulse in said multichannel pulse train configured to excite said image region, and including a subsequent plurality of refocusing pulses that respectively excite nuclear spins so as to produce an echo signal to acquire raw data for each image of the image series;
    in said computerized processor, automatically determining at least one defined marking region within said image region that is dependent on a structure in the subject to be depicted in said image region, and configuring said multichannel pulse train to include a saturation pulse before said excitation pulse, said saturation pulse being configured to saturate nuclear spins at or in said at least one marking region upon emission of said saturation pulse; and
    emitting an electronic signal from said computerized processor, representing said control sequence, in a form for operating said magnetic resonance system according to said control sequence.

2. A method as claimed in claim 1 comprising determining said marking region based on image data obtained from the subject in a prior data acquisition that takes place before operating said magnetic resonance system according to said control sequence.

3. A method as claimed in claim 1 comprising designating said marking region so as to include at least on locally separate marking point.

4. A method as claimed in claim 1 comprising designating said marking region so as to be correlated with at least one anatomical landmark, as said subject structure.

5. A method as claimed in claim 1 comprising determining said marking region as a contour of a structure in said image region.

6. A method as claimed in claim 5 comprising determining said marking region so as to enclose said at least one structure in said image region.

7. A method as claimed in claim 1 comprising determining said marking region by automatically extracting said marking region from image data acquired prior to operating said magnetic resonance system according to said control sequence.

8. A method to generate an image series of a defined region of an examination subject by operation of a magnetic resonance system comprising a plurality of different independent radio-frequency (RF) transmission channels, comprising:
    in a computerized processor, defining a control sequence to generate an image series of a defined image region of an examination subject, said control sequence comprising a multichannel pulse train that causes said different independent RF transmission channels to radiate respective RF pulse trains in parallel;
    in said computerized processor, including an excitation pulse in said multichannel pulse train configured to excite said image region, and including a subsequent plurality of refocusing pulses that respectively excite nuclear spins so as to produce an echo signal to acquire raw data for each image of the image series;
    in said computerized processor, automatically determining at least one defined marking region within said image region that is dependent on a structure in the subject to be depicted in said image region, and configuring said multichannel pulse train to include a saturation pulse before said excitation pulse, said saturation pulse being configured to saturate nuclear spins at or in said at least one marking region upon emission of said saturation pulse; and
    emitting an electronic signal from said computerized processor, representing said control sequence, and using said electronic signal to operate said magnetic resonance system according to said control sequence.

9. A method to determine structural data of an examination subject, comprising:
    acquiring an image series of a defined region of an examination subject by operating a magnetic resonance system according to a control sequence, said magnetic resonance system comprising a plurality of different independent radio-frequency (RF) transmission channels;
    automatically determining said control sequence by, in a computerized processor, defining a control sequence to generate an image series of a defined image region of an examination subject, said control sequence comprising a multichannel pulse train that causes said different independent RF transmission channels to radiate respective RF pulse trains in parallel, in said computerized processor, including an excitation pulse in said multichannel pulse train configured to excite said image region, and including a subsequent plurality of refocusing pulses that respectively excite nuclear spins so as to produce an echo signal to acquire raw data for each image of the image series, in said computerized processor, automatically determining at least one defined marking region within said image region that is dependent on a structure in the subject to be depicted in said image region, and configuring said multichannel pulse train to include a saturation pulse before said excitation pulse, said saturation pulse being configured to saturate nuclear spins at or in said at least one marking region upon emission of said saturation pulse, and emitting an electronic signal from said computerized processor, representing said control sequence, in a form for operating said magnetic resonance system according to said control sequence;

in a processor, automatically identifying markings of a structure in the subject in said images in said image series achieved by said locally defined saturation generated by said saturation pulse;

automatically determining structure data representing said structure using said identified markings in said different images in said image series; and making a designation of said structure data available at an output of said processor in electronic form.

10. A method as claimed in claim 9 comprising automatically determining said structure data using position variations of said identified markings respectively in said different images of said image series.

11. A method as claimed in claim 9 comprising determining said structure data using geometric dimensions of at least regions of the identified markings, or dimensions between different identified markings.

12. A control sequence determination device to determine a control sequence for a magnetic resonance system comprising a plurality of different, independent radio-frequency (RF) transmission channels, said device comprising:

a computerized processor configured to define a control sequence to generate an image series of a defined image region of an examination subject, said control sequence comprising a multichannel pulse train that causes said different independent RF transmission channels to radiate respective RF pulse trains in parallel;

in said computerized processor being configured to include an excitation pulse in said multichannel pulse train configured to excite said image region, and to include a subsequent plurality of refocusing pulses that respectively excite nuclear spins so as to produce an echo signal to acquire raw data for each image of the image series;

said computerized processor being configured to automatically determine at least one defined marking region within said image region that is dependent on a structure in the subject to be depicted in said image region, and to configure said multichannel pulse train to include a saturation pulse before said excitation pulse, said saturation pulse being configured to saturate nuclear spins at or in said at least one marking region upon emission of said saturation pulse; and said computerized processor having an output of which an electronic signal is emitted, representing said control sequence, in a form for operating said magnetic resonance system according to said control sequence.

13. A structural data determination device to determine structural data of an examination subject, comprising:

a computerized control sequence determination device configured to automatically define a control sequence to generate an image series of a defined image region of an examination subject in a magnetic resonance system, said control sequence comprising a multichannel pulse train that causes different independent radio-frequency (RF) transmission channels of the magnetic resonance system to radiate respective RF pulse trains in parallel, in said computerized processor, including an excitation pulse in said multichannel pulse train configured to excite said image region, and including a subsequent plurality of refocusing pulses that respectively excite nuclear spins so as to produce an echo signal to acquire raw data for each image of the image series, and to automatically determine at least one defined marking region within said image region that is dependent on a structure in the subject to be depicted in said image region, and to configure said multichannel pulse train to include a saturation pulse before said excitation pulse, said saturation pulse being configured to saturate nuclear spins at or in said at least one marking region upon emission of said saturation pulse, and to emit an electronic signal from representing said control sequence, in a form for operating said magnetic resonance system according to said control sequence;

a control unit supplied with said electronic signal representing said control sequence and configure to operate said magnetic resonance system according to said control sequence to acquire said image series of said defined region of an examination subject a processor configured to automatically identify markings of a structure in the subject in said images in said image series achieved by said locally defined saturation generated by said saturation pulse;

said processor being configured to automatically determine structure data representing said structure using said identified markings in said different images in said image series; and said processor being configured to make a designation of said structure data available at an output of said processor in electronic form.

14. A magnetic resonance system comprising:

a magnetic resonance data acquisition unit comprising a plurality of different, independent radio-frequency (RF) transmission channels;

a computerized processor configured to define a control sequence to generate an image series of a defined image region of an examination subject in said data acquisition unit, said control sequence comprising a multichannel pulse train that causes said different independent RF transmission channels to radiate respective RF pulse trains in parallel;

said computerized processor being configured to include an excitation pulse in said multichannel pulse train configured to excite said image region, and to include a subsequent plurality of refocusing pulses that respectively excite nuclear spins so as to produce an echo signal to acquire raw data for each image of an image series;

said computerized processor being configured to automatically determine at least one defined marking region within said image region that is dependent on a structure in the subject to be depicted in an image region, and to configure said multichannel pulse train to include a saturation pulse before said excitation pulse, said saturation pulse being configured to saturate nuclear spins at or in said at least one marking region upon emission of said saturation pulse; and said computerized processor being configured to emit an electronic signal, representing said control sequence; and said data acquisition unit comprising a control unit supplied with said electronic signal and configured to operate said magnetic resonance system according to said control sequence to acquire said image series.

15. A magnetic resonance system to determine structural data of an examination subject, comprising:

a magnetic resonance data acquisition unit comprising a plurality of different, independent radio-frequency (RF) transmission channels;

a computerized control sequence determination device configured to automatically define a control sequence to generate an image series of a defined image region of an examination subject in said magnetic resonance data acquisition unit, said control sequence comprising a multichannel pulse train that causes different independent radio-frequency (RF) transmission channels to radiate respective RF pulse trains in parallel, in said computerized processor, including an excitation pulse in said multichannel pulse train configured to excite said image region, and including a subsequent plurality of refocusing pulses that respectively excite nuclear spins so as to produce an echo signal to acquire raw data for each image of the image series, and to automatically determine at least one defined marking region within said image region that is dependent on a structure in the subject to be depicted in said image region, and to configure said multichannel pulse train to include a saturation pulse before said excitation pulse, said saturation pulse being configured to saturate nuclear spins at or in said at least one marking region upon emission of said saturation pulse, and to emit an electronic signal from representing said control sequence, in a form for operating said magnetic resonance system according to said control sequence;

a control unit supplied with said electronic signal representing said control sequence and configure to operate said data acquisition unit according to said control sequence to acquire said image series of said defined region of an examination subject a processor configured to automatically identify markings of a structure in the subject in said images in said image series achieved by said locally defined saturation generated by said saturation pulse;

said processor being configured to automatically determine structure data representing said structure using said identified markings in said different images in said image series; and said processor being configured to make a designation of said structure data available at an output of said processor in electronic form.

16. A non-transitory, computer-readable data storage medium encoded with programming instructions, said storage medium being loaded into a computerized control device of a magnetic resonance system, said magnetic resonance system comprising a plurality of different independent radio-frequency (RF) transmission channels, said programming instructions causing said control device to:

define a control sequence to generate an image series of a defined image region of an examination subject, said control sequence comprising a multichannel pulse train that causes said different independent RF transmission channels to radiate respective RF pulse trains in parallel;

include an excitation pulse in said multichannel pulse train configured to excite said image region, and including a subsequent plurality of refocusing pulses that respectively excite nuclear spins so as to produce an echo signal to acquire raw data for each image of the image series;

determine at least one defined marking region within said image region that is dependent on a structure in the subject to be depicted in said image region, and configure said multichannel pulse train to include a saturation pulse before said excitation pulse, said saturation pulse being configured to saturate nuclear spins at or in said at least one marking region upon emission of said saturation pulse; and emit an electronic signal, representing said control sequence, in a form for operating said magnetic resonance system according to said control sequence.

17. A non-transitory, computer-readable data storage medium encoded with programming instructions, said storage medium being loaded into a computerized control device of a magnetic resonance system, said magnetic resonance system comprising a plurality of different independent radio-frequency (RF) transmission channels, said programming instructions causing said control device to:

operate said magnetic resonance system according to said control sequence, to acquire an image series of a defined region of an examination subject;

determine said control sequence as a multichannel pulse train that causes said different independent RF transmission channels to radiate respective RF pulse trains in parallel, in said computerized processor, and that includes an excitation pulse in said multichannel pulse train configured to excite said image region, and that includes a subsequent plurality of refocusing pulses that respectively excite nuclear spins so as to produce an echo signal to acquire raw data for each image of the image series, determine at least one defined marking region within said image region that is dependent on a structure in the subject to be depicted in said image region, and configure said multichannel pulse train to include a saturation pulse before said excitation pulse, said saturation pulse being configured to saturate nuclear spins at or in said at least one marking region upon emission of said saturation pulse, and emit an electronic signal from said computerized processor, representing said control sequence, in a form for operating said magnetic resonance system according to said control sequence;

identify markings of a structure in the subject in said images in said image series achieved by said locally defined saturation generated by said saturation pulse;

determine structure data representing said structure using said identified markings in said different images in said image series; and make a designation of said structure data available at an output of said processor in electronic form.

* * * * *